United States Patent [19]

Langdon et al.

[11] Patent Number: 4,887,033

[45] Date of Patent: Dec. 12, 1989

[54] MAGNETOMETER HAVING COIL FORMED BY TWO SPIRAL SHAPED CONDUCTORS

[75] Inventors: Roger M. Langdon, Colchester; Cyril Smith, Alton, both of United Kingdom

[73] Assignee: General Motors Corporation, Detroit, Mich.

[21] Appl. No.: 163,577

[22] Filed: Mar. 3, 1988

[30] Foreign Application Priority Data

Mar. 6, 1987 [GB] United Kingdom ............... 8705247

[51] Int. Cl.$^4$ ..................... G01R 33/04; G01C 17/28
[52] U.S. Cl. ...................................... 324/253; 33/361
[58] Field of Search .............. 324/253, 254, 255, 249, 324/326–329, 239; 336/232, 200; 33/361, 362

[56] References Cited

U.S. PATENT DOCUMENTS

| | | | |
|---|---|---|---|
| 3,185,947 | 5/1965 | Freymodsson | 336/232 |
| 3,626,729 | 12/1971 | Walden | 324/329 |
| 4,255,711 | 3/1981 | Thompson | 324/329 |
| 4,668,100 | 5/1987 | Murakami et al. | 33/361 |

FOREIGN PATENT DOCUMENTS

| | | |
|---|---|---|
| 130940 | 1/1985 | European Pat. Off. . |
| 1597324 | 9/1981 | United Kingdom . |
| 2083230 | 3/1982 | United Kingdom . |
| 2136581 | 9/1984 | United Kingdom . |

*Primary Examiner*—Reinhard J. Eisenzopf
*Assistant Examiner*—Walter E. Snow
*Attorney, Agent, or Firm*—Lawrence B. Plant

[57] ABSTRACT

A fluxgate magnetometer includes a body of magnetic material, a drive coil and a sensing coil. At least one of the drive coil and the sensing coil is composed of two portions, each of the two portions being disposed in generally parallel planes which are spaced apart and respectively include an electrically insulating substrate and a spiral shaped portion which is electrically conductive supported by the electrically insulating substrate, the two portions being electrically connected such that electric current flows in the respective spiral shaped portions in opposite rotational senses relative to the body of magnetic material.

8 Claims, 3 Drawing Sheets

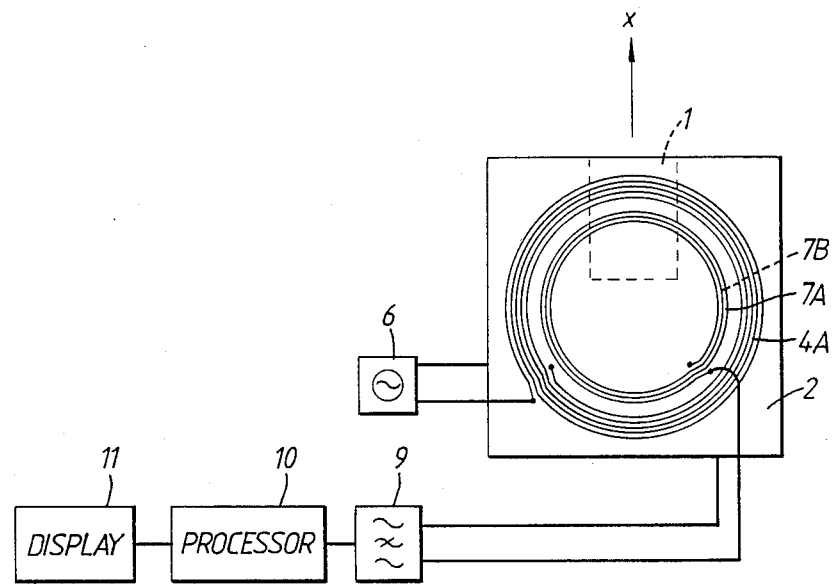
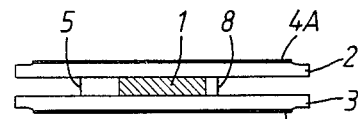
FIG. 1A.
FIG. 1B.

MAGNETOMETER HAVING COIL FORMED BY TWO SPIRAL SHAPED CONDUCTORS

FIELD OF THE INVENTION

This invention relates to fluxgate magnetometers.

DESCRIPTION OF THE PRIOR ART

Fluxgate magnetometers operate by driving a sample of magnetic material into saturation by applying an alternating magnetic field to it. This field is produced by an alternating current passing through drive coils. If a reading coil is then placed to intercept the magnetic flux through the sample of magnetic material, an alternating output voltage containing components proportional to the magnitude of any external magnetic fields present will be produced by the reading coil.

Conventional fluxgate magnetometers generally have two main disadvantages, they require large amounts of electrical power to function and are physically bulky. If it is attempted to reduce the size of such magnetometers the coils and magnetic material will be very fragile.

These problems make fluxgate magnetometers unsuitable for use in applications where low power consumption or small size are essential, magnetic mines for example.

It was an objective of the present invention to produce a type of fluxgate magnetometer that at least partially overcomes these drawbacks.

BRIEF SUMMARY OF THE INVENTION

This invention provides a fluxgate magnetometer including a body of magnetic material, a drive coil and a sensing coil, and wherein at least one of the coils is formed as a thin planar layer of an electrically conductive material and said body being in the form of a planar layer which is adjacent and parallel to the plane of said coil from which it is electrically insulated.

BRIEF DESCRIPTION OF THE SEVERAL VIEWS OF THE DRAWING

The invention will now be described with reference to the accompanying figures, in which:

FIG. 1A shows a magnetometer embodying the invention in plan view, in schematic form;

FIG. 1B shows an end view of the magnetometer of FIG. 1A;

DETAILED DESCRIPTION

Figure 2A:
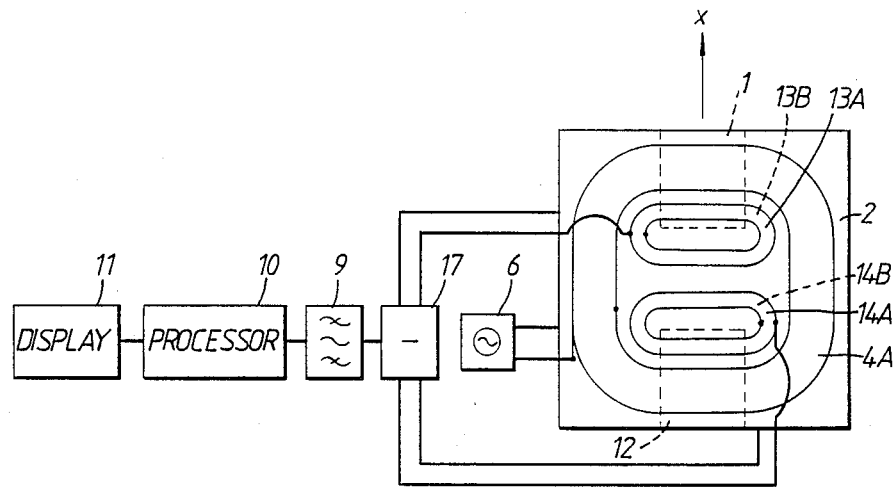
FIG. 2A shows another design of magnetometer embodying the invention in plan view, in schematic form.

A simple design for a fluxgate magnetometer is shown in FIGS. 1A and 1B. A thin layer of magnetic material 1 is sandwiched between two substrates 2 and 3.

Two drive coils 4A and 4B are formed on the substrates 2 and 3 respectively. The coils 4A and 4B are formed on the substrates 2 and 3 by screen printing with an ink containing metallic particles and then firing to form a metallic track defining the coil, but other methods such as photo-lithographic etching could be used. Each drive coil 4A and 4B consists of a spiral track of conductive material laid down on one substrate.

The two drive coils 4A and 4B are connected by a conductive link 5. The two drive coils 4A and 4B are connected in opposition by the conductive link 5 so that current will be contrarotating in the two drive coils 4A and 4B. The two drive coils 4A and 4B are supplied with alternating current by an A.C. source 6.

Two reading coils 7A and 7B are also formed on the substrates 2 and 3 respectively. Each reading coil 7A and 7B consists of a spiral conductive track of conductive material laid down on one substrate. The two reading coils 7A and 7B are connected in opposition by a conductive link 8.

The reading coils 7A and 7B are connected to a bandpass filter 9 and the output of this filter is supplied to a processor 10. The processor 10 controls a display 11.

In operation, the A.C. source 6 produces contrarotating alternating currents in the drive coils 4A and 4B. These currents produce an oscillating magnetic field which drives the magnetic material 1 into saturation.

The changing magnetic flux in the magnetic material 1 will produce an output voltage in the reading coils 7A and 7B. This output voltage will include alternating components at the drive frequency, at odd harmonics of the drive frequency due to the non-linearity of the magnetic material and at even harmonics of the drive frequency due to the effects of external magnetic fields acting on the magnetic material 1.

The amplitudes of the components of the output voltage at even harmonics of the drive frequency will be proportional to the strength of any components of external magnetic fields in the direction X.

The bandpass filter 9 passes signals at one of these even harmonic frequencies to the processor 10 which calculates the strength of the external magnetic fields in the direction X, from the amplitude at this frequency. The strength of the external magnetic fields, acting in th direction X, is then displayed on the display 11.

The sensitivity of this magnetometer could be increased by replacing the bandpass filter 9 with a plurality of bandpass filters, each centered on a separate even harmonic of the drive frequency. However, because the amplitude at the drive frequency will always be far greater than that at any of the harmonics, such filters are hard to design, and the sensitivity of the magnetometer will be very difficult to increase.

Figure 2B:
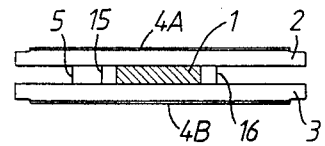
FIG. 2B shows an end view of the magnetometer of FIG. 2A.

An improved design of magnetometer is shown in FIG. 2. Two thin portions of magnetic material 1 and 12 are sandwiched between the substrates 2 and 3. The two drive coils 4A and 4B are connected together by a conductive link 5 and supplied with alternating current from an A.C. source 6 as before.

Two pairs of reading coils 13A and 13B and 14A and 14B are formed by spiral tracks of conductive material on the substrates 2 and 3. The first pair of reading coils 13A and 13B are connected in opposition by a conductive link 15. The second pair of reading coils 14A and 14B are similarly connected in opposition by a conductive link 16. The two pairs of reading coils 13A and 13B and 14A and 14B are connected to a subtractor 17. The output of the subtractor 17 is fed to a bandpass filter 9, a processor 10 and a display 11 as before.

In operation, the current from A.C. source 6 through the drive coils 4A and 4B generates an alternaing magnetic fluid which drives the two thin layer of magnetic material 1 and 12 into saturation. The changing magnetic flux in the magnetic material 1 induces a voltage in the reading coils 13A and 13B, while the changing magnetic flux in the magnetic material 12 induces a voltage in the reading coils 14A and 14B. The voltage signals from coils 13A and 13B and from coils 14A and 14B will both contain components at the drive frequency, and at odd and even harmonics of the drive frequency.

Provided the magnetic material 1 and 12 and the two pairs of coils, 13A, 13B and 14A, 14B are respectively identical, the components of the signal from the coils 13A, 13B and 14A, 14B at the drive frequency and odd harmonics of the drive frequency will cancel out, while the components at the even harmonics of the drive frequency will reinforce one another. These components are then passed through a bandpass filter 9 which has a passband centered on one of the even harmonics of the drive frequency. The filtered signal is then fed to the processor 10 which calculates the components of magnetic field strength, in the direction X, acting on the magnetic material, and displays this field strength on the display 11.

The single bandpass filter 9 could be replaced by a plurality of bandpass filters each centred on a different even harmonic of the drive frequency.

This design will have higher sensitivity than the one shown in FIG. 1, because the signals at the drive frequency and add harmonics of the drive frequency cancel out, improving the signal-to-noise ratio of the signals produced by the magnetometer, and making design of suitable bandpass filters easier.

Figure 3A:
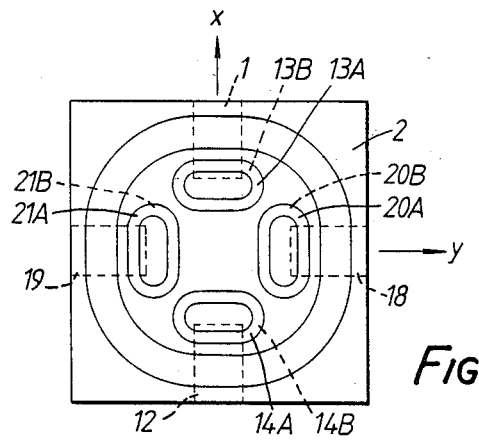
FIG. 3A shows another design of magnetometer embodying the invention in plan view in schematic form.
Figure 3B:
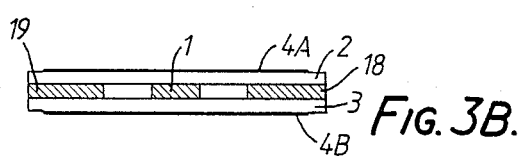
FIG. 3B shows an end view of the magnetometer of FIG. 3A.

A magnetometer capable of measuring magnetic field strengths in two dimensions is shown in FIG. 3. This is a magnetometer like that in FIG. 2 with the addition of two more thin portions of magnetic material, 18 and 19 at right angles to the thin layers of magnetic material 1 and 12. The portions of magnetic material 18 and 19 are sandwiched between the substrates 2 and 3 and are driven into saturation by the drive coils 4A and 4B, like the magnetic material 1 and 12.

The magnetic material 18 has a pair of associated reading coils 20A and 20B and the magnetic material 19 has a pair of associated reading coils 21A and 21B. The two layers of a magnetic material 18 and 19 and their associated reading coils 20A and 20B, 21A and 21B are connected to a processing system like that shown in FIG. 2, so that the magnetometer can measure magnetic fields in the direction Y as well as in the direction X.

Figure 4A:
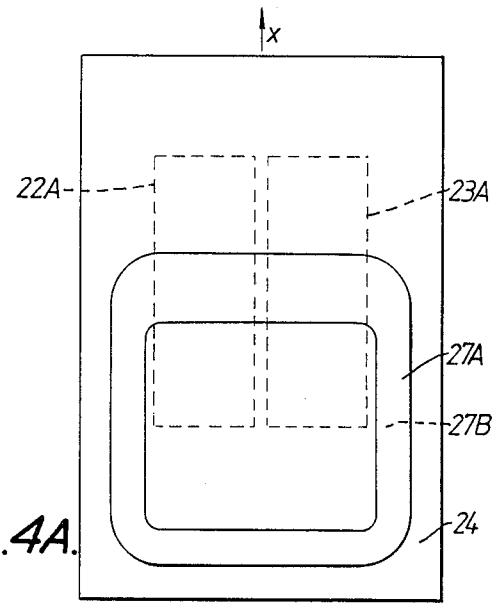
FIG. 4A shows another design of magnetometer embodying the invention in plan view.
Figure 4B:
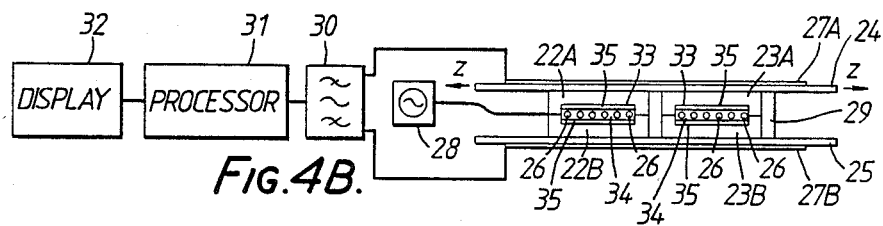
FIG. 4B shows an end view of the magnetometer of FIG. 4A in schematic form.
Figure 4C:
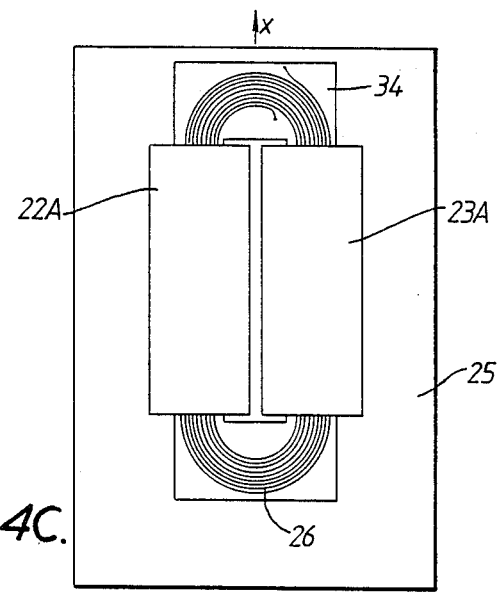
FIG. 4C shows a plan view cut away along the plane Z—Z of the magnetometer shown in FIG. 4B.

A preferred form of magnetometer is shown in FIG. 4. This comprises four portions of magnetic material, 22A and 22B and 23A and 23B arranged in two layers. These portions of magnetic material 22A, 22B, 23A and 23B are supported by a pair of substrates 24 and 25. A drive coil 26 is laid down on a thin insulating substrate 34 and then covered by an insulating layer 35. The drive coil 26, substrate 34 and insulating layer 35 are then sandwiched between the portions of magnetic material, between 22A and 22B and between 23A and 23B. The portions of magnetic material are shaped to form two magnetic circuits wrapped around the drive coil 26, one magnetic circuit is formed by portions of magnetic material 22A and 22B and the other is formed by portions 23A and 23B. A pair of reading coils 27A and 27B are formed on the substrates 24 and 25 respectively. The drive coil 26 and the reading coils 27A and 27b are formed by thin spiral tracks of conductive material like those in the previous examples.

The drive coil 26 is connected to an alternating current source 28. The two reading coils 27A and 27B are connected by a conductive link 29. The output of the reading coils 27A and 27B is fed to a bandpass filter 30, and the filtered output is then fed to a processor 31. The processor 31 controls a display 32.

In operation, the alternating current through the drive coil 26 generates an alternating magnetic field which drives the magnetic material 22A, 22B, 23A and 23B into saturation. Each pair of portions of magnetic material 22A and 22B and 23A and 23B forms a magnetic circuit.

The changing flux in the magnetic material generates a voltage in the reading coils 27A and 27B. This voltage will have components at the frequency of the drive current, at odd harmonics of the drive current due to nonlinearity of the magnetic material and at even harmonics of the drive frequency with amplitude proportional to external magnetic field strength in the direction X. The magnetic cirucit formed by magnetic layers 22A and 22B will always have current flowing in the section of the drive coil 26 which passes through it in the opposite direction to the current flow in the section of the drive coil 26 which passes through the magnetic circuit formed by the magnetic layers 23A and 23B. Thus the component of the induced voltage at the drive frequency and the component of the induced voltage at odd harmonics of the drive frequency produced in the reading coils 27A and 27B will cancel because, provided the pairs of layers of magnetic material 27A, 27B and 23A, 23B are respectively the same size, the magnetic circuits formed by the two pairs 22A, 22B and 23A, 23B will induce equal and opposite voltages in the reading coils 27A and 27B at these frequencies. The components of the induced voltage at even harmonics of the drive frequency however, add together.

The bandpass filter 30 has a series of passbands each centred on one of the even harmonics of the drive frequency. The signals passed by the bandpass filter 30 are fed to the processor 31 which uses them to calculate the magnetic field strength in the direction X, and displays this on the display 32.

The current needed to drive the magnetic material to saturation will generally be reduced if the magnetic material is made thinner and if the area 33 enclosed by the magnetic circuits is made smaller. It is generally advantageous to reduce the current needed to drive a magnetometer, especially if it is to be used in a battery powered device, so the layers of magnetic material 22A, 22B and 23A, 23B and the drive coil 26 will be made as thin as is practicable.

The sensitivity of the magnetometer is dependent upon, among the other things, the length to width ratio of the layers of magnetic mayterial, 22A, 22B, 23A, 23B, so these layers of magnetic material will be made as long as is required to achieve the required sensitivity.

We claim:

1. A fluxgate magnetometer comprising a body of magnetic material, a drive coil, a sensing coil, and a pair of substrates spaced apart a predetermined distance and disposed on opposite sides of said body of magnetic material, each of said substrates being electrically insulating; one of said drive coil and said sensing coil being composed of two portions, each of said two portions being respectively disposed on and supported by one of said substrates in respective planes which are generally parallel and in spaced relationship, each of said two portions including an electrically conductive spiral shaped portion, the other one of said drive coil and said sensing coil being supported by at least one of said substrates, and said two portions being electrically connected together such that electric current flows in the respective said spiral shaped portions in opposite rotational senses.

2. A fluxgate magnetometer as claimed in claim 1, further comprising three additional bodies of magnetic material disposed between said substrates and three additional sensing coils respectively disposed adjacently to each of said three additional bodies of magnetic material for measurement of magnetic fields in two different directions.

3. A fluxgate magnetometer as claimed in claim 1, wherein the other one of said drive coil and said sensing coil includes two other portions disposed on respective ones of said substrates, each of said two other portions including a wound portion which has a generally spiral shaped configuration, and wherein each said wound portion is generally coplanar with and surrounds a corresponding one of said two portions of said one of said drive coil and said sensing coil.

4. A fluxgate magnetometer as claimed in claim 1, wherein the other one of said drive coil and said sensing coil includes two other portions which are respectively disposed on each of said substrates.

5. A fluxgate magnetometer as claimed in claim 4, wherein each of said two other portions includes an electrically conductive spiral shaped portion, said spiral shaped portions of said two other portions being electrically connected together such that electric current flows therein in opposite rotational senses.

6. A fluxgate magnetometer as claimed in claim 4, further comprising an alternating current source connected to said drive coil, said alternating current source producing an oscillating magnetic field in said drive coil for driving said body of magnetic material into magnetic saturation.

7. A fluxgate magnetometer, comprising:
   two pairs of bodies of magnetic material, each of said pair of bodies respectively forming a magnetic circuit;
   a drive coil having two portions which each pass through one of the magnetic circuits;
   two substrates spaced a predetermined distace apart and disposed on opposite sides of said two pairs of bodies of magnetic material, each of said substrates being electrically insulating;
   a sensing coil having two electrically conductive spiral shaped portions respectively disposed on and supported by said substrates in respective planes which are generally parallel and in spaced relationship with each oher, said spiral shaped portions being electrically connected together such that electric current flows in the respective said spiral shaped portions in opposite rotational senses.

8. A fluxgate magnetometer as claimed in claim 7, further comprising an alternating current source connected to said drive coil, said alternating current source producing an oscillating magnetic field in said drive coil for driving each of said two pairs of bodies into magnetic saturation.

* * * * *

UNITED STATES PATENT AND TRADEMARK OFFICE
CERTIFICATE OF CORRECTION

PATENT NO. : 4,887,033
DATED : December 12, 1989
INVENTOR(S) : Roger M. Langdon et al It is certified that error appears in the above-identified patent and that said Letters Patent is hereby corrected as shown below:

In the heading of the patent, amend [73] Assignee to read --The General Electric Company, p.l.c., London, United Kingdom.--.

Under "Attorney, Agent, or Firm", change the firm to --SPENCER & FRANK--.

Signed and Sealed this

Seventeenth Day of April, 1990

Attest:

HARRY F. MANBECK, JR.

*Attesting Officer*  *Commissioner of Patents and Trademarks*